(12) United States Patent
Nada et al.

(10) Patent No.: US 7,719,016 B2
(45) Date of Patent: May 18, 2010

(54) LIGHT-EMITTING DIODE DEVICE AND BACKLIGHT APPARATUS AND LIQUID-CRYSTAL DISPLAY APPARATUS USING LIGHT-EMITTING DIODE DEVICE

(75) Inventors: Naoji Nada, Kanagawa (JP); Yoshihiro Oshima, Gifu (JP); Toshitaka Kawashima, Kanagawa (JP); Satoshi Tomioka, Kanagawa (JP); Junichi Osako, Tokyo (JP)

(73) Assignee: Sony Corporation, Tokyo (JP)

( * ) Notice: Subject to any disclaimer, the term of this patent is extended or adjusted under 35 U.S.C. 154(b) by 702 days.

(21) Appl. No.: 11/277,843

(22) Filed: Mar. 29, 2006

(65) Prior Publication Data
US 2006/0221592 A1 Oct. 5, 2006

(30) Foreign Application Priority Data
Mar. 31, 2005 (JP) .............................. 2005-104497

(51) Int. Cl.
*H01L 33/00* (2010.01)
(52) U.S. Cl. ................... 257/95; 257/98; 257/E33.067; 257/E33.068; 362/800; 362/97.3
(58) Field of Classification Search .................. 257/98, 257/99, 100, E33.073, 95, E33.067, E33.068; 349/61, 62, 65; 362/97.3, 612, 800
See application file for complete search history.

(56) References Cited

U.S. PATENT DOCUMENTS 6,361,190 B1    3/2002   McDermott 6,469,755 B1    10/2002  Adachi et al.
2005/0263785 A1*  12/2005 Kim et al. .................... 257/100
2006/0102914 A1*  5/2006  Smits et al. .................... 257/98

FOREIGN PATENT DOCUMENTS

EP           1 453 107            9/2004

OTHER PUBLICATIONS

Nikkei Electronics (Nikkei Business Publication Inc.), Dec. 20, 2004, (No. 889), pp. 123 to 130.
European Search Report issued on Mar. 25, 2009, for corresponding Patent Application EP 06004740.4.

\* cited by examiner

*Primary Examiner*—Minh-Loan T Tran
(74) *Attorney, Agent, or Firm*—K&L Gates LLP

(57) ABSTRACT

A light-emitting diode device and backlight apparatus and liquid-crystal display apparatus using light-emitting diode device are provided. A light-emitting diode device has a lens covered around a light-emitting diode chip and a processed portion for adjusting light going from the light-emitting diode chip along the central axis of the lens is provided at the light-emitting diode chip or the lens or being provided right above the lens. The light-emitting diode chip is processed near the central axis by a suitable method such as etching. Alternatively, a diffusion material containing low refractive index material portion or an angle selective film is provided on the lens. A light-emitting diode device is able to adjust a quantity of light emitted from the LED chip along the central axis of the lens so that light can be radiated with a desired angle distribution. A backlight apparatus and a liquid-crystal display apparatus are able to suppress ununiformity of brightness and ununiformity of color by using the above-mentioned light-emitting diode device.

13 Claims, 12 Drawing Sheets

FIG. 3
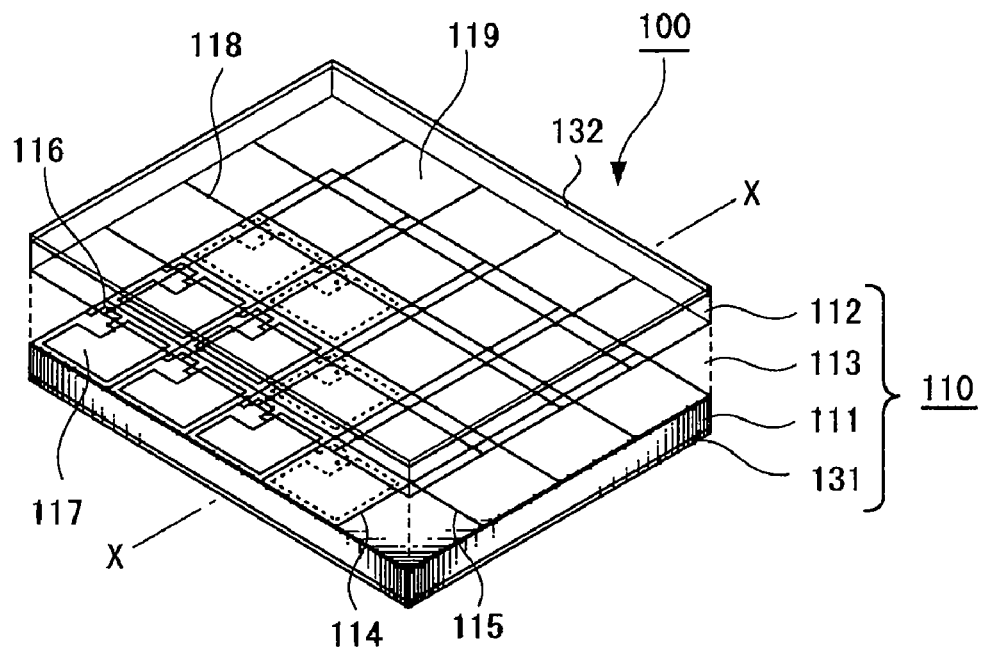
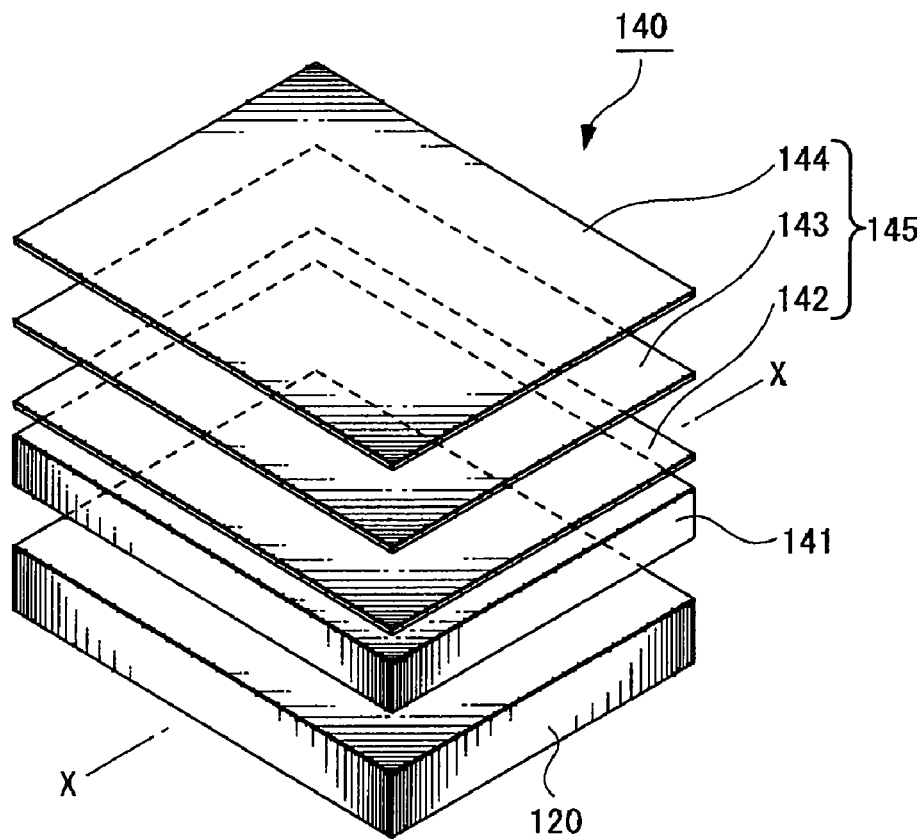

LIGHT-EMITTING DIODE DEVICE AND BACKLIGHT APPARATUS AND LIQUID-CRYSTAL DISPLAY APPARATUS USING LIGHT-EMITTING DIODE DEVICE

CROSS REFERENCES TO RELATED APPLICATIONS

The present application claims priority to Japanese Patent Application JP 2005-104497 filed in the Japanese Patent Office on Mar. 31, 2005, the entire contents of which is being incorporated herein by reference.

BACKGROUND

The present invention relates generally to a light-emitting diode device using a light-emitting diode chip as a light emitting source thereof. More particularly, this invention relates to a light-emitting diode device which can be applied to a backlight apparatus for illuminating a liquid-crystal display panel from the back thereof and a backlight apparatus and a liquid-crystal apparatus using the light-emitting diode device.

In recent years, instead of a CRT (cathode-ray tube), very thin display apparatus such as a liquid-crystal display (LCD) apparatus and a plasma display panel (PDP) apparatus have been proposed so far and they are now commercially available on the market as display apparatus for use with television receivers. In particular, liquid-crystal display apparatus using liquid-crystal display panels can be driven with low power consumption and large-size liquid-crystal display panels become more inexpensive so that they are widely used progressively. Therefore, the liquid-crystal display apparatus are now technically under study and development.

In such liquid-crystal display apparatus, backlight type liquid-crystal display apparatus capable of displaying color image by surface-illuminating a transmissive liquid-crystal display panel with a color filter from the back side with a backlight apparatus become the mainstreams.

A cold cathode fluorescent lamp (CCFL) using a fluorescent tube to emit white light and a light-emitting diode (LED) are considered to be promising light sources of the backlight apparatus.

In particular, after a blue light-emitting diode has been developed, light-emitting diodes which are able to emit red light, green light and blue light of three primary colors of light become completed. Thus, when red light, green light and blue light emitted from these light-emitting diodes are mixed, it is possible to obtain white light with high color purity. Accordingly, since color purity is increased through the liquid-crystal display panel by using the light-emitting diodes as the light source of the backlight apparatus, it is possible to considerably widen a color reproduction range as compared with that of the CCFL (cold cathode fluorescent lamp). Further, it is possible to considerably increase brightness of the backlight apparatus by using a light-emitting diode (LED) with high output.

When the LED is used as the light source of the backlight apparatus as described above, if the LED is of the right-under type, that is, the LED is located right under the light emission surface, then since the LED is a point source, it is unavoidable that brightness will become ununiform and that color will become ununiform.

As a method for solving this problem, there was proposed a side-emitter type light-emitting diode device, that is, so-called LED module in which a lens surrounding an LED chip which emits light in all directions is formed as a shape to reflect light, emitted above, in the lateral direction to thereby emit light mainly in the lateral direction. See, NIKKEI ELECTRONICS (NIKKEI BUSINESS PUBLICATION INC.), Dec. 20, 2004, (No. 889), pp. 123 to 130.

Since the backlight apparatus using such side-emitter type light-emitting diode devices can easily mix respective lights of RGB (red, green and blue) and can prevent brightness and color from becoming ununiform, the above backlight apparatus is useful.

However, even when the light-emitting diode device for emitting light mainly in the lateral direction is in use as described above, it is not yet possible to completely remove light emitted right above the light-emitting diode.

FIG. 1 of the accompanying drawings is a schematic cross-sectional view showing an arrangement of a light-emitting diode device in which a lens surrounding the light-emitting diode is formed as a shape to emit light mainly in the lateral direction. FIG. 1 shows an example of a light-emitting diode device in which a light-emitting diode chip 1 is disposed on a sub-mount 2, a lens 3 which surrounds the sub-mount 2 being shaped as a convex-like curved surface protruded in the lateral direction, the upper portion of the lens 3 being shaped as a concave-like curved surface.

FIG. 2 shows a typical light radiation angle distribution in this example. As very small peaks lie within an angular extent shown by a solid line A in FIG. 2, it is to be noted that a light-emitting diode device using a related-art light-emitting diode may not avoid light from being emitted in the direction right above the lens. Light emitted in the direction right above the lens may not be mixed with light emitted from other LED with a desired ratio, which causes color to be ununiform.

The light emitted in the direction right above the LED as described above is light going straight from the LED chip along the central axis of the lens without being refracted within the lens. The reason for this is that, when a lens is manufactured by a suitable process such as injection molding, if the upper portion of the lens, for example, the acute angle portion is not accurately formed with a desired angle, then light going right above the lens may not be completely emitted in the lateral direction and thereby leaked in the upper portion.

On the other hand, there is proposed a method in which a reflection coating surface is provided right above the lens of the light-emitting diode or a method in which a transparent substrate is provided on the upper portion of the light-emitting diode, a pattern of a photo-absorption member being formed on the portion right above a light source by a suitable method such as printing to thereby decrease light emitted in the direction right above the light-emitting diode (LED) as has been described so far in the above-described Cited Non-Patent Reference 1. According to these methods, however, although red light is decreased in the portion right above the red LED, intensities of green light and blue light emitted from the surrounding light-emitting diodes (LEDs) are increased relatively and hence it is unavoidable that light of cyan, which is mixed color of green and blue, becomes conspicuous.

Therefore, even when the display apparatus has the above-mentioned arrangement in which the upper surface is shielded from the light, such arrangement is not sufficient so that it is difficult to completely remove a brilliant point caused by light leaked from substantially the central position of the light-emitting diode, that is, so-called hot spot and that it is also difficult to avoid ununiformity of brightness and ununiformity of color. In order to sufficiently decrease ununiformity of brightness and ununiformity of color, it is necessary to relatively increase a space between the light source and the display panel. Thus, it is difficult to decrease the thickness of the backlight apparatus and the liquid-crystal display apparatus. Further, depending on the materials of the reflection coating and photo-absorption material, an amount of absorbed light and a quantity of ineffective light are increased, which may cause luminous efficiency to be lowered and a utilization efficiency of light also is caused to be decreased.

SUMMARY

In view of the aforesaid aspects, the present invention intends to provide a light-emitting diode device capable of adjusting a quantity of light emitted from a light-emitting diode (LED) chip along the central axis of a lens to the above so that ununiformity of brightness and ununiformity of color can be suppressed.

Further, the present invention intends to provide a backlight apparatus and a liquid-crystal display apparatus capable of suppressing ununiformity of brightness and ununiformity of color by using this light-emitting diode device.

According to an aspect of the present invention, there is provided a light-emitting diode device in which a lens is covered around a light-emitting diode chip and which has a processed portion for adjusting light going from the light-emitting diode chip along the central axis of the lens.

Then, according to the present invention, this processed portion is disposed on the light-emitting diode chip or the lens or the processed portion is disposed on both of the light-emitting diode chip or the lens.

Also, a backlight apparatus and a liquid-crystal display apparatus according to the present invention may use the light-emitting diode device having the above-mentioned arrangement of the present invention as the light source of the backlight apparatus.

More specifically, the present invention intends to provide the backlight apparatus for illuminating a transmissive type liquid-crystal display panel from the back side thereof. The light source is composed of a plurality of light-emitting diode devices of which lens is covered around the light-emitting diode chip and a processed portion for adjusting light going from the light-emitting diode chip along the central axis of the lens is disposed on the light-emitting diode chip and/or the lens.

Also, a liquid-crystal display apparatus according to the present invention has an arrangement using the light-emitting diode device having the above-mentioned arrangement of the present invention. That is, according to the present invention, in the liquid-crystal display apparatus including a transmissive type liquid-crystal display panel and a backlight apparatus for illuminating this liquid-crystal display panel from the back side, a light source of the backlight apparatus is composed of a plurality of light-emitting diode devices of which lens is covered around the light-emitting diode chip and in which a processed portion for adjusting light going from the light-emitting diode chip along the central axis of the lens is disposed on the light-emitting diode chip and/or the lens.

According to the above-mentioned present invention, the processed portion for adjusting light going along the central axis of the lens is disposed on the light-emitting diode chip or the lens surrounding the light-emitting diode chip.

As this processed portion, there is provided a processed portion which is obtained by processing the light-emitting diode chip itself or there is provided a processed portion for adjusting light being disposed on the upper surface of the lens or being disposed right above the lens. This processed portion is not a member which may shield or absorb light but a member which may adjust a brightness distribution of light emitted from the light-emitting diode device by controlling a radiation distribution of light emitted from the light-emitting diode chip or by diffusing and reflecting light emitted right above the lens or by reflecting the light emitted from the light-emitting diode chip at a desired angle. Thus, as compared with the case in which light is shielded or absorbed, not only light emitted right above the light-emitting diode, that is, light emitted along the central axis of the lens can be decreased or the amount of such light can be adjusted.

Accordingly, the backlight apparatus and the liquid-crystal display apparatus using such light-emitting diode device as the light source are able to improve ununiformity of brightness and ununiformity of color.

As described above, according to the light-emitting diode device of the present invention, it is possible to adjust the quantity of light emitted right above the light-emitting diode device.

Also, according to the backlight apparatus and the liquid-crystal display apparatus of the present invention, it is possible to improve uniformity of brightness and uniformity of color.

Additional features and advantages are described herein, and will be apparent from, the following Detailed Description and the figures.

BRIEF DESCRIPTION OF THE FIGURES

FIG. 3 is a schematic external perspective view showing an example of a color liquid-crystal display apparatus according to the present invention.

DETAILED DESCRIPTION

Figure 1:
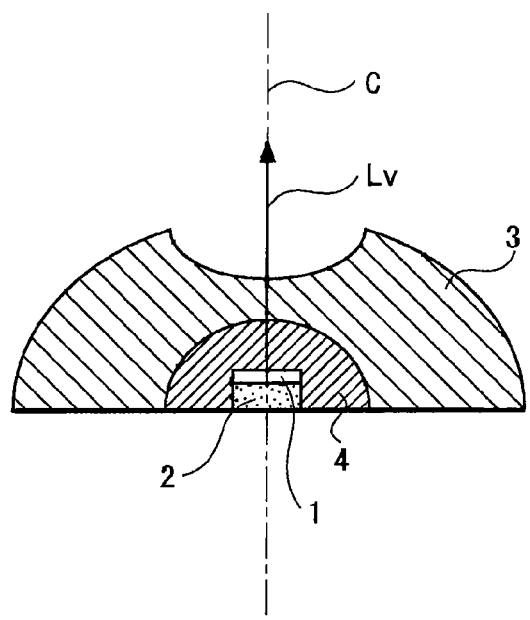
FIG. 1 is a schematic cross-sectional view showing an arrangement of an example of a light-emitting diode device according to the related art.

While the embodiments of the present invention will be described below with reference to the drawings, it is needless to say that the present invention is not limited to the embodiments which will follow.

The present invention can be applied to a transmissive type color liquid-crystal display apparatus 100 having an arrangement shown in FIG. 3, for example.

This transmissive type color liquid-crystal display apparatus, generally denoted by reference numeral 100 in FIG. 3, is composed of a transmissive type color liquid-crystal display panel 110 and a backlight apparatus 140 provided on the back side of this transmissive type color liquid-crystal display panel 110. Although not shown, the transmissive type color liquid-crystal display apparatus 100 may include a receiving unit such as an analog tuner and a digital tuner for receiving ground waves and satellite waves, a video signal processing unit and an audio signal processing unit for processing a video signal and an audio signal received at the receiving unit, respectively, and an audio signal output unit such as a speaker for outputting an audio signal processed by the audio signal processing unit.

As shown in FIG. 3, the transmissive type color liquid-crystal display panel 100 has an arrangement in which two transparent substrates (that is, a TFT (thin film transistor) substrate 111 and an opposite electrode substrate 112), made of glass, are arrayed in an opposing fashion, a liquid-crystal layer 113 with twisted-nematic (TN) liquid-crystal occluded therein being provided in a gap between the TFT substrate 111 and the opposite electrode substrate 112. The TFT substrate 111 has a signal line 114 arrayed in a matrix fashion, a scanning line 115, a thin film transistor 116 disposed at an intersection point between the signal line 114 and the scanning line 115 as a switching element and a pixel electrode 117. The thin film transistor 116 is sequentially selected by the scanning line 115 and it writes a video signal supplied from the signal line 114 in the corresponding pixel electrode 117. On the other hand, an opposite electrode 118 and a color filter 119 are formed on the inner surface of the opposite electrode substrate 112.

Figure 4:
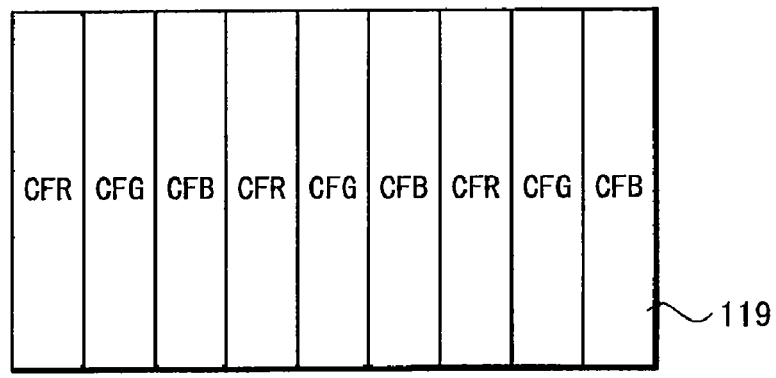
FIG. 4 is a schematic plan view showing an arrangement of an example of a color filter of a liquid-crystal display panel that the color liquid-crystal display apparatus includes according to the present invention.

The color filter 119 is divided to provide a plurality of segments corresponding to respective segments. For example, as shown in FIG. 4, the color filter 119 is divided to provide three segments of a red filter CFR, a green filter CFG and a blue filter CFB of three primary colors. The arrangement pattern of the color filter 119 is not limited to the stripe pattern arrangement shown in FIG. 4 and a delta pattern arrangement, a square pattern arrangement and the like may also be possible although not shown.

Referring back to FIG. 3, the arrangement of the transmissive type color liquid-crystal display apparatus 100 will be described. As shown in FIG. 3, the transmissive type color liquid-crystal display apparatus 100 has the transmissive type color liquid-crystal display panel 110 having the above-mentioned arrangement sandwiched by two polarizing plates 131 and 132. When this transmissive type color liquid-crystal display apparatus 100 is driven in an active matrix fashion in the state in which white light is irradiated on the transmissive type color liquid-crystal display apparatus 100 from the back side by the backlight apparatus 140, the transmissive type color liquid-crystal display apparatus 100 is able to display a desired full color picture.

The backlight apparatus 140 illuminates the above-described color liquid-crystal display panel 110 from the back side of the transmissive type color liquid-crystal display apparatus 100. As shown in FIG. 3, the backlight apparatus 140 includes a light source, not shown, and an optical function sheet group 145 such as a diffuser 141, a diffuser sheet 142, a prism sheet 143 and a polarizing conversion sheet 144 located within a backlight housing portion 120.

The diffuser 141 may uniform brightness in surface-emission by internally diffusing light emitted from the backlight housing portion 120.

It is customary that the optical function sheet group is composed of sheets having a function to analyze incident light into orthogonal polarized components, for example, a function to compensate a phase difference between light waves to increase an angle of view up to a wide angle and to prevent coloring, a function to diffuse incident light, a function to improve brightness and the like. The optical function sheet group is provided in order to convert light surface-emitted from the backlight apparatus 140 into illumination light having optical characteristics most suitable for illuminating the color liquid-crystal display panel 110. Accordingly, the arrangement of the optical function sheet group 145 is not limited to the above-mentioned diffuser sheet 142, prism sheet 143 and polarizing conversion sheet 144, and various optical function sheets can be used.

Figure 5:
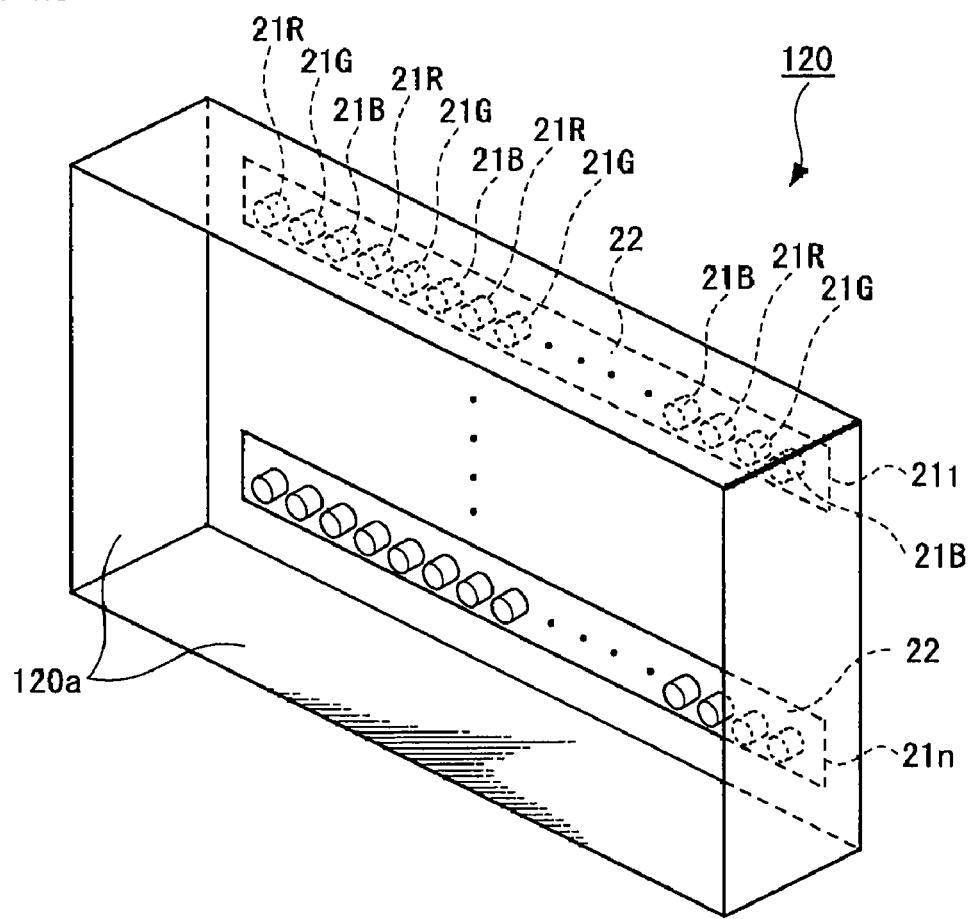
FIG. 5 is a schematic perspective view showing an arrangement of a backlight apparatus that the color liquid-crystal display apparatus includes according to the present invention.

FIG. 5 is a schematic perspective view showing an arrangement within the backlight housing portion 120. As shown in FIG. 5, the backlight housing portion 120 uses a light-emitting diode device having an inventive arrangement, which will be described later on, by using a red light-emitting diode device 21R for emitting red light, a green light-emitting diode device 21G for emitting green light and a blue light-emitting diode device 21B for emitting blue light as light sources to thereby use light-emitting diode device of respective inventive arrangements which will be described later on. For example, a peak wavelength of red light emitted from the red light-emitting diode device 21R, a peak wavelength of green light emitted from the green light-emitting diode device 21G and a peak wavelength of blue light emitted from the blue light-emitting diode device 21B may fall within approximately 640 nm, 530 nm and 450 nm, respectively. The peak wavelengths of red light and blue light emitted from the red light-emitting diode device 21R and the blue light-emitting device 21B may be shifted from 640 nm to the longer wavelength and may be shifted from 450 nm to the shorter wavelength, respectively. If the peak wavelengths are shifted to the longer wavelength and the shorter wavelength, respectively, as described above, then it is possible to widen a color gamut. Therefore, it is possible to enlarge a color reproduction range of a picture displayed on the color liquid-crystal display panel.

When the red light-emitting diode device 21R, the green light-emitting diode device 21G and the blue light-emitting diode device 21G are generally referred to in the following explanation, they will be generally referred to as a "light-emitting diode device 21" for simplicity.

Figure 2:
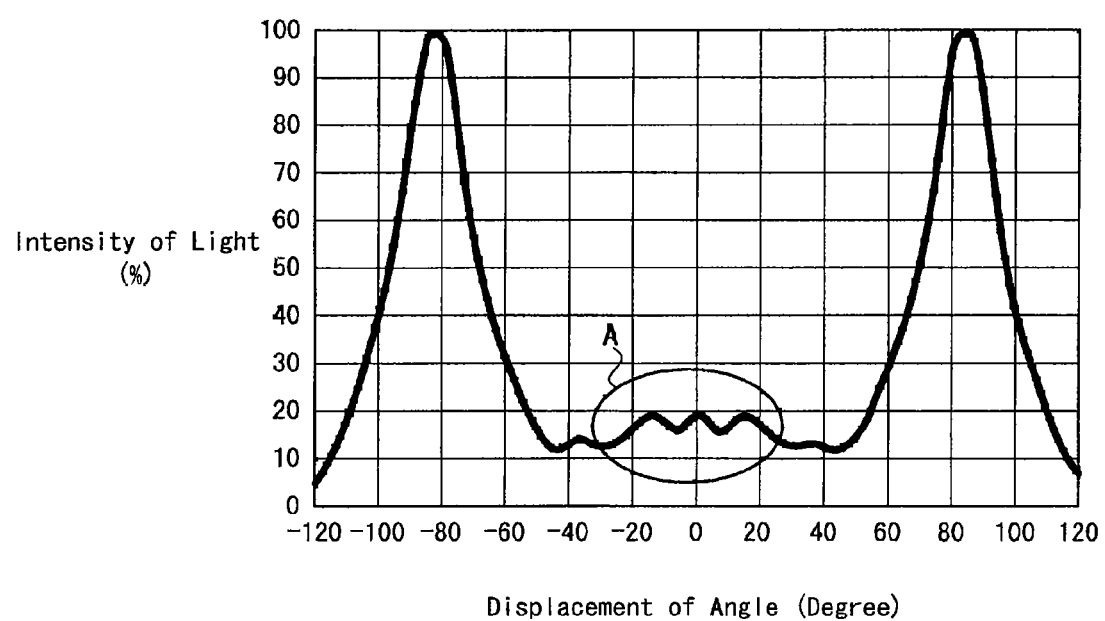
FIG. 2 is a diagram showing a radiation angle distribution of an example of a light-emitting diode device according to the related art.

The light-emitting diode device 21 is of the side emitting type such as the LED chip for providing the aforementioned radiation directivity characteristic shown in FIG. 2 or of the side emitting type such as the LED chip having the lens shape described in the aforementioned Cited Non-Patent Reference 1 to radiate light mainly in the lateral direction.

As shown in FIG. 5, a plurality of light-emitting diode devices 21 is arrayed on the substrate 22 in row in the desired order, thereby resulting in light-emitting diode unit 21*n* (n is a natural number) being formed.

As the order to array the light-emitting diode devices 21 on the substrate 22 in order to form the light-emitting diode unit 21*n*, various methods of arrangements may be available such as the method of the most fundamental arrangement in which the red light-emitting diode device 21R, the green light-emitting diode device 21G and the blue light-emitting diode device 21B are repeated as shown in FIG. 5 and the method of the arrangement in which the green light-emitting diode devices 21G are arrayed at an equal distance, the red light-emitting diode device 21R and the blue light-emitting diode device 21B being alternately arrayed between the adjacent green light-emitting diode devices 21G although not shown.

The light-emitting diode unit 21*n* may be arrayed within the backlight housing portion 120 in such a manner that the longitudinal direction of the light-emitting diode unit 21*n* may become the horizontal direction as shown in FIG. 5 or in such a manner that the longitudinal direction of the light-emitting diode unit 21*n* may become the vertical direction or the above-mentioned two arrangements may be combined.

Also, according to the method for arranging the light-emitting diode unit 21*n* in such a manner that the longitudinal direction of the light-emitting diode unit 21*n* may become the horizontal direction or the vertical direction, since this method of arrangement becomes the same as the method of the arrangement of the CCFL (cold cathode fluorescent lamp) in which the light-emitting diode unit is used as the light source of the backlight apparatus so far, accumulated know-how in design can be used so that a cost can be reduced and that a time required until the light-emitting diode device is to be manufactured can be shortened.

The inner wall surface 120*a* of the backlight housing portion 120 is formed as the reflective surface in order to increase utilization efficiency of light emitted from the light-emitting diode device 21.

Figure 6:
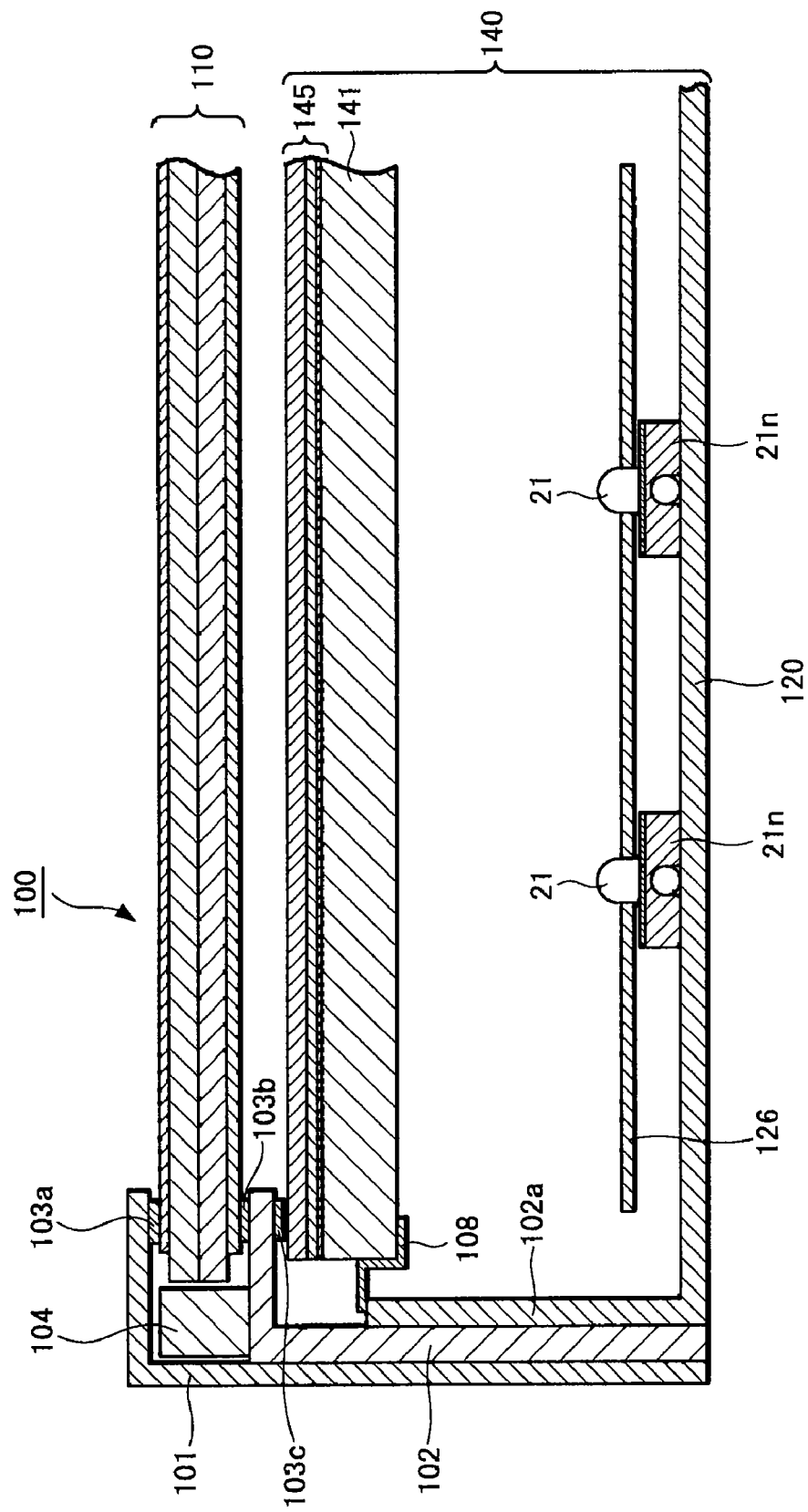
FIG. 6 is a schematic cross-sectional view showing an arrangement of an example of a color liquid-crystal display apparatus according to the present invention.

FIG. 6 is a partially cross-sectional view taken along the line XX of the transmissive type color liquid-crystal display apparatus 100 shown in FIG. 3 when the transmissive type color liquid crystal display apparatus 100 is assembled. As shown in FIG. 6, the color liquid-crystal display panel 110 constructing the transmissive type color liquid-crystal display apparatus 100 is held by an outer frame 101 and an inner frame 102 serving as the outer housing of the transmissive type color liquid-crystal display apparatus 100 through spacers 103*a* and 103*b*. Also, a guide member 104 is provided between the outer frame 101 and the inner frame 102 so as to prevent the color liquid-crystal display panel 110 sandwiched between the outer frame 101 and the inner frame 102 from being displaced in the longitudinal direction.

On the other hand, the backlight apparatus 140 constructing the transmissive type color liquid-crystal display apparatus 100 includes the diffuser 141 with the several kinds of optical function sheets 145 being laminated as described above. Also, a reflective sheet 126 is disposed between the diffuser 141 and the backlight housing portion 120.

The reflective sheet 126 is located in such a manner that its reflective surface may be opposed to the light incident surface 141*a* of the diffuser 141 and that its reflective surface may be opposed to the side of the backlight housing portion 120 rather than the light-emitting direction of the light-emitting diode device 21. As the reflective sheet 126, there can be used a silver reflective film with high reflectivity enhanced by forming a multi-layer thin film which consists of a silver thin film, a transparent thin film with low refractive index, and a transparent thin film with high refractive index on a sheet base material, in that order, and the like. Also, this reflective sheet 126 may reflect light emitted mainly from the light-emitting diode device 21 and which is downwardly emitted depending on its radiation angle distribution, light reflected on the inner wall surface 120*a* which is formed as a reflective surface by reflection-processing the backlight housing portion 120 and the like.

The diffuser 141 is held by a bracket 108 provided in the backlight housing portion 120.

Figure 7:
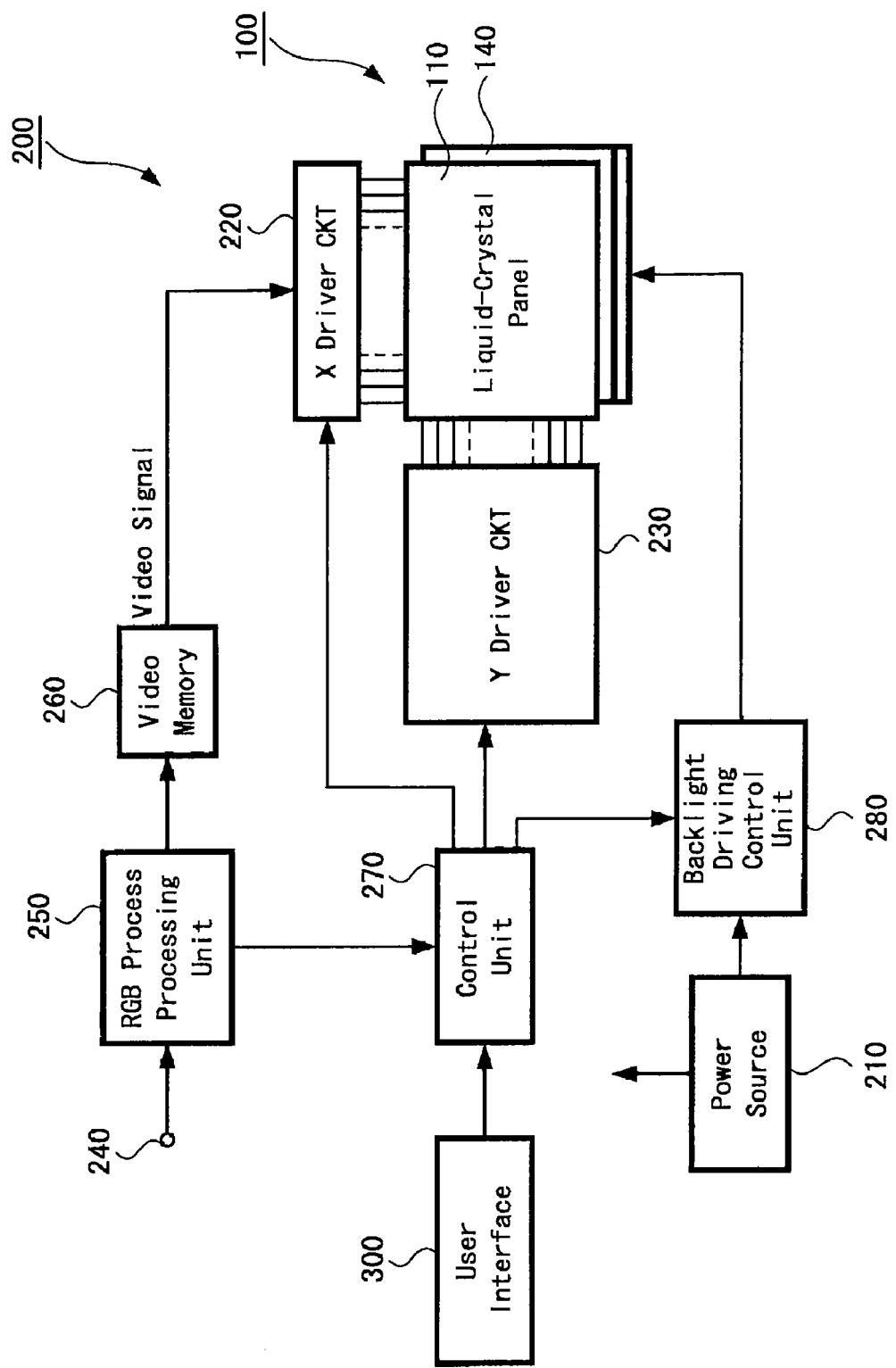
FIG. 7 is a schematic block diagram showing an arrangement of an example of a driving circuit that drives the color liquid-crystal display apparatus according to the present invention.

The transmissive type color liquid-crystal display apparatus 100 having the above-mentioned arrangement is driven by a driving circuit 200 shown in FIG. 7, for example. As shown in FIG. 7, the driving circuit 200 includes a power source 210 for supplying driving power of the color liquid-crystal display panel 110 and the backlight apparatus 140, an X driver circuit 220 and a Y driver circuit 230 for driving the color liquid-crystal display panel 110, an RGB process processing unit 250 to which video signals supplied from the outside and video signals received at a receiving unit (not shown) of the transmissive type color liquid-crystal display apparatus 100 and which are processed by the video signal processing unit are supplied through an input terminal 140, a backlight driving control unit 280 for controlling driving of a video memory 260, a control unit 270 and a backlight driving control unit 280 connected to this RGB process processing unit 250.

In this driving circuit 200, the video signal inputted through the input terminal 240 is processed in a suitable signal processing fashion such as a chroma signal processing by the RGB process processing unit 250. Further, this video signal is converted from a composite signal into an RGB separate signal suitable for driving the color liquid-crystal display panel 110, supplied to the control unit 270 and it is further supplied through the video memory 260 to the X driver circuit 220.

Also, the control unit 270 controls the X driver circuit 220 and the Y driver circuit 230 at a predetermined timing corresponding to the above-described RGB separate signal to drive the color liquid-crystal display panel 110 by the video signal from the video memory 260 and the RGB separate signal supplied to the X driver circuit 220 to thereby display a picture corresponding to the above-described separate RGB signal.

The backlight driving control unit 280 generates a pulse width modulation (PWM) signal from the voltage supplied from the power supply 210 to drive the respective light-emitting diode devices 21 that are the light sources of the backlight apparatus 140. It is customary that a color temperature of the light-emitting diode depends on an operation current. Accordingly, in order to reproduce colors with fidelity (in order to make a color temperature become constant) while desired brightness is being obtained, it is necessary to suppress the change of colors by driving the light-emitting diode device 21 with the pulse width modulation (PWM) signal.

A user interface 300 is an interface which is used to select a received channel by the above-mentioned receiving unit (not shown), to adjust a volume of sound output outputted from the audio output unit (not shown) and which is used to execute brightness adjustment of white color from the backlight apparatus 140 which illuminates the color liquid-crystal display panel 110, white balance adjustment and the like.

For example, when the user adjusts brightness from the user interface 300, a brightness control signal is transmitted through the control unit 270 of the driving circuit 200 to the backlight driving control unit 280. The backlight driving control unit 280 controls driving of the red light-emitting diode device 21R, the green light-emitting diode device 21G and the blue light-emitting diode device 21B by changing the duty ratio of the pulse width modulation signal in response to this brightness control signal at each of the red light-emitting diode device 21R, the green light-emitting diode device 21G and the blue light-emitting diode device 21B.

Next, the detailed arrangement of the light-emitting diode according to the present invention will be described with reference to the drawings. In the description which will follow, the central axis of the lens assumes a rotary axis required when the lens has a rotationally symmetric structure. When the lens becomes irrotationally symmetric due to manufacturing error caused upon injection molding or when the lens is formed like asymmetric shape, the position which becomes substantially the center of a brightness distribution of emitted light as seen from the upper surface may be assumed to be a perpendicular which is drawn from the position corresponding to the central axis to the light-emitting diode chip. The light-emitting diode device according to the present invention may use a lens of any shape.

First, in the following first to fifth inventive examples, respective examples in which a processed portion for adjusting light going in the direction right above the light-emitting diode chip is provided on the light-emitting diode chip itself will be described.

Example One

Figure 8A:
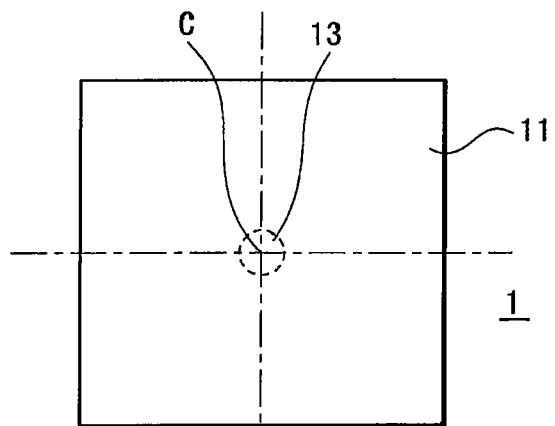
FIG. 8A is a schematic plan view showing an arrangement of a light-emitting diode device according to an embodiment of the present invention.
Figure 8B:
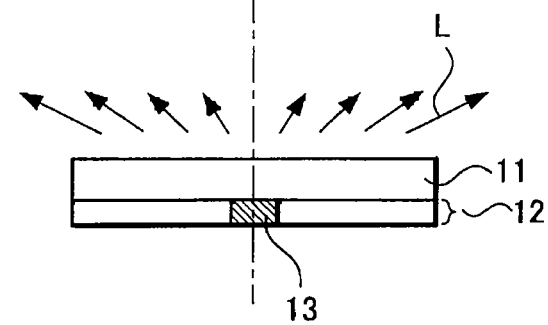
FIG. 8B is a schematic cross-sectional view showing an arrangement of a light-emitting diode device according to an embodiment of the present invention.

FIG. 8A is a schematic plan view showing an arrangement of an example of a light-emitting diode device according to the present invention from the side of a substrate 11, and FIG. 8B is a schematic cross-sectional view showing an arrangement of an example of a light-emitting diode device according to the present invention.

As shown in FIG. 8B, a light-emitting diode chip 1 has the substrate 11 on which a light-emitting structure portion 12 in which a buffer layer, a first cladding layer, an active layer, a second cladding layer, a capping layer (not shown) and the like are laminated, in that order, is formed by a crystal growth method. Then, wirings are connected to electrodes (not shown) of this light-emitting diode chip 1 by a suitable method such as wire bonding and located on the mold. Then, a lens of a desired shape surrounding the circumference of the light-emitting diode chip 1 is fixed so as to cover the light-emitting diode chip 1 and thereby a light-emitting diode device is constructed.

In Example One the position opposing the central axis of the lens (not shown) is shown by a dot-and-dash line intersection point C in FIG. 8A, and a processed portion 13 having a dim structure or a non-light emission structure is provided at the position corresponding to the area shown by broken line which surrounds this intersection point C. This processed portion 13 is shown hatched in FIG. 8B.

In this case, as the processed portion 13, this portion may be formed as a pattern which does not emit light or which emits a very small quantity of light when the light-emitting structure portion 12 is manufactured. Also, after this portion was manufactured similarly to the ordinary light-emitting diode chip, this portion may be removed up to the depth of the light-emitting region by pattern-etching or laser processing and thereby formed as the processed portion 13.

As other method, the active layer may be inactivated by implanting ions on this portion.

This region need not always be formed so as to have a non-light emitting structure by providing the processed portion 13 and this region may be formed so as to have a dim structure.

While the substrate 11 of the light-emitting diode chip 1 is disposed on the side of the lens 2 in the illustrated example, this inventive example can be applied to a light-emitting diode device having an arrangement in which the substrate 11 is disposed on the opposite side of the lens, the light-emitting structure portion 12 such as the active layer being located on the upper side, that is, the side of the lens 3.

Then, even when a very small non-light emission (or dim) structure is provided at the central portion of the light-emitting diode chip 1 as described above, luminous efficiency is not so lowered on the whole. For example, when a non-light emission structure with a diameter of 1 μm is provided at the central portion of a light-emitting diode chip of a 1 mm×1 mm square, luminous efficiency is hardly changed.

While the plane shape of the processed portion 13 is circular in FIG. 8A, it is not limited thereto and it may be formed as other shapes such as a square. Also, it is desirable that the area of the processed portion 13 should be properly selected in consideration of the purpose of the apparatus using this light-emitting diode device, the shape of the lens of the light-emitting diode, the number and arrangement of the light-emitting diode device and the like.

According to the above-mentioned arrangement, it becomes possible to adjust a quantity of light emitted from the light-emitting diode chip 1 itself in the direction right above the light-emitting diode chip 1, that is, a quantity of light emitted in the direction right above the lens along the central axis of the lens which covers the light-emitting diode chip 1. Therefore, as mentioned hereinbefore, light going in the direction right above the light-emitting diode chip 1 can be prevented from being shielded completely and such light can be satisfactorily mixed with ambient lights of other colors. Thus, it becomes possible to satisfactorily suppress hot spot and hence ununiformity of brightness and ununiformity of color can be suppressed satisfactorily. As a consequence, while it is customary that a backlight apparatus in which light-emitting diode devices are provided in order to improve ununiformity of brightness and ununiformity of color has been relatively as thick as about 50 mm, it becomes possible to reduce the thickness of this backlight apparatus and also it becomes possible to decrease the thicknesses of the backlight apparatus and the liquid-crystal display apparatus using this backlight apparatus. Also, a part of light emitted from the light-emitting diode chip 1 is absorbed and hence such light can be used efficiently.

Example Two

Example Two in which a processed portion is provided on a light-emitting diode chip similarly to the Example One will be described with reference to FIGS. 9A and 9B.

In Example Two, the substrate 11 of the light-emitting diode chip 1 is disposed on the side of the lens 3 and a curved surface or an inclined surface having a tangential line which does not cross the central line of the lens 3 of the substrate 11 at a right angle is provided at the position opposing to the central axis of the lens 3 of the substrate 11, thereby resulting in the processed portion 13 being constructed. In FIGS. 9A and 9B, elements and parts identical to those of FIGS. 8A and 8B are denoted by identical reference numerals and therefore need not be described.

Figure 9A:
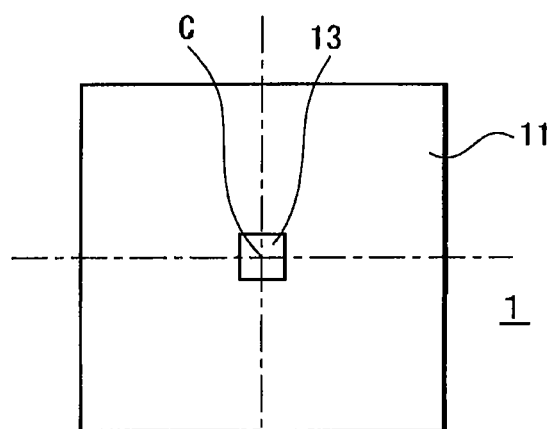
FIG. 9A is a schematic plan view showing an arrangement of a light-emitting diode device according to an embodiment of the present invention.
Figure 9B:
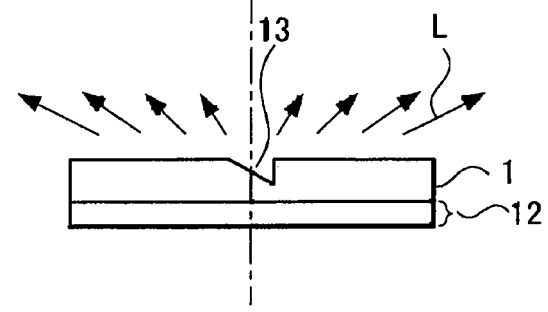
FIG. 9B is a schematic cross-sectional view showing an arrangement of a light-emitting diode device according to an embodiment of the present invention.

As shown in FIG. 9A, in Example Two, a concave portion of a planar square shape is provided at the position opposing to the central axis, shown by the point C, of the lens as the processed portion 13, and this concave portion is constructed by an inclined surface whose one cross-section is triangular and this inclined surface is formed as a surface which does not become perpendicular to the central axis of the lens as shown in FIG. 9B. The processed portion 13 of this concave shape may be formed as a concave-like curved surface insofar as the tangential line of the position crossing the central axis does not cross the central axis of the lens at a right angle or it may be shaped so as to become asymmetric with respect to the central axis of the lens near the central axis. Also in this case, the plane shape of the processed portion 13 may be other suitable ones and it is desirable that its area should be selected properly.

This processed portion 13 can be formed as a desired shape with high accuracy by processing the substrate 11 with a ultrashort pulse laser such as a femto-second laser.

In this case, since light emitted from the light-emitting diode chip 1 along the central axis of the lens is radiated in the upper oblique direction in accordance with an inclination of the inclined surface or the curved surface, it is possible to adjust a quantity of light emitted in the direction right above the light-emitting diode chip 1. Also, a part of light emitted from this light-emitting diode chip 1 can be prevented from being absorbed and hence such light can be utilized efficiently.

Example Three

Figure 10A:
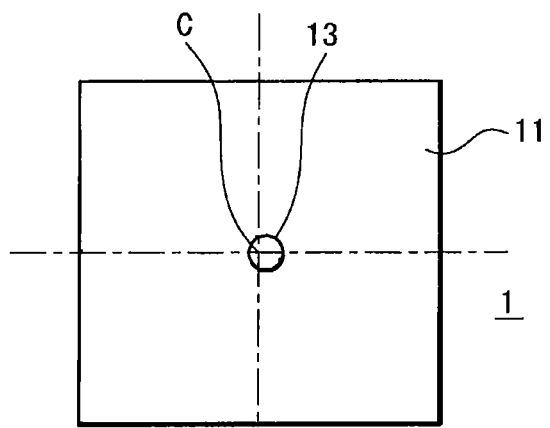
FIG. 10A is a schematic plan view showing an arrangement of a light-emitting diode device according to an embodiment of the present invention.
Figure 10B:
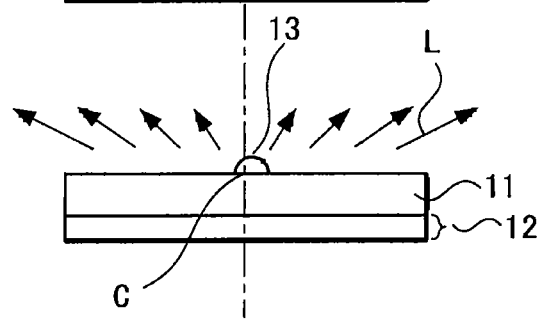
FIG. 10B is a schematic cross-sectional view showing an arrangement of a light-emitting diode device according to an embodiment of the present invention.

Example Three is the case in which the substrate 11 of the light-emitting diode chip 1 is located on the side of the lens 3 similarly to the above-mentioned second inventive example. In Example Three, a curved surface having a tangential line which does not cross the central axis of the lens of the substrate 11 at a right angle is provided at the position opposing to the central axis of the lens of the substrate 11 and this curved surface may be constructed as the processed portion 13. Example Three is the example in which the convex-like processed portion 13 is provided near the position opposing to the central axis shown by the point C as shown in FIGS. 10A and 10B. In FIGS. 10A and 10B, elements and parts identical to those of FIGS. 8A and 8b are denoted by identical reference numerals and therefore need not be described.

Such convex-like processed portion 13 can be formed by dropping and solidifying a suitable material such as rein. The convex-like processed portion 13 may be formed in such a manner that the tangential line does not become perpendicular to the central axis at the position opposing to the central axis, for example, that its top portion may be displaced from the central axis.

Also in this case, since light emitted from the light-emitting diode chip 1 along the central axis of the lens is radiated in the upper oblique direction in accordance with the inclination of the inclined surface or the curved surface, it is possible to adjust a quantity of light emitted in the direction right above the light-emitting diode chip 1. Also, a part of light emitted from this light-emitting diode chip 1 can be prevented from being absorbed and hence such emitted light can be utilized efficiently.

Example Four

Figure 11A:
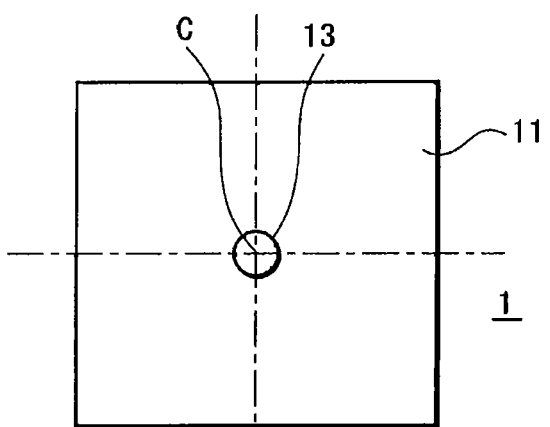
FIG. 11A is a schematic plan view showing an arrangement of a light-emitting diode device according to an embodiment of the present invention.
Figure 11B:
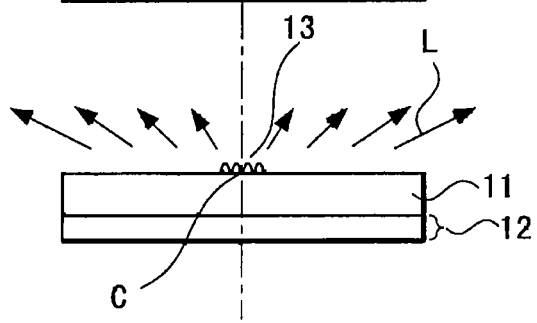
FIG. 11B is a schematic cross-sectional view showing an arrangement of a light-emitting diode device according to an embodiment of the present invention.

Example Four is an example in which the position C opposing to the central axis of the lens of the substrate 11 is formed as a rough surface and thereby shaped like the processed portion 13 when the substrate 11 of the light-emitting diode chip 1 is located on the side of the lens 3 as shown in FIGS. 11A and 11B. Such processed portion 13 can be formed relatively easily by partially roughening its surface with selective etching or with a suitable method such as mechanical processing and dry etching depending on the size of the light-emitting diode chip 1. Also, it is desirable that the area to be processed should properly be selected in accordance with the purpose in which the light-emitting diode chip 1 is used, the number and arrangement of the light-emitting diode, the shape of the lens and the like.

In this case, since light emitted from the light-emitting diode chip 1 along the central axis of the lens is diffused and reflected on the rough surface of the processed portion 13, it is possible to adjust a quantity of light emitted in the direction right above the light-emitting diode chip 1. Also, a part of light emitted from this light-emitting diode chip 1 can be prevented from being absorbed and hence emitted light can be utilized with high efficiency.

Example Five

Figure 12A:
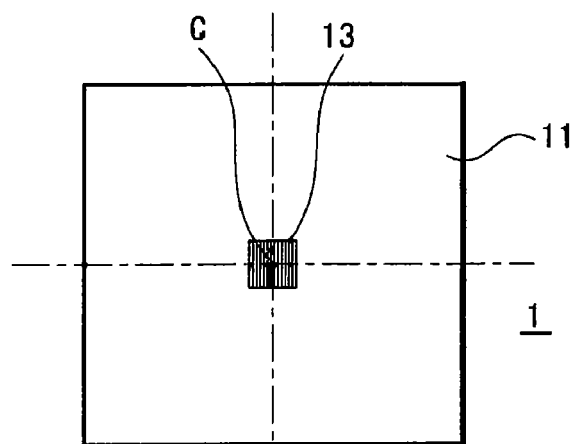
FIG. 12A is a schematic plan view showing an arrangement of a light-emitting diode device according to an embodiment of the present invention.
Figure 12B:
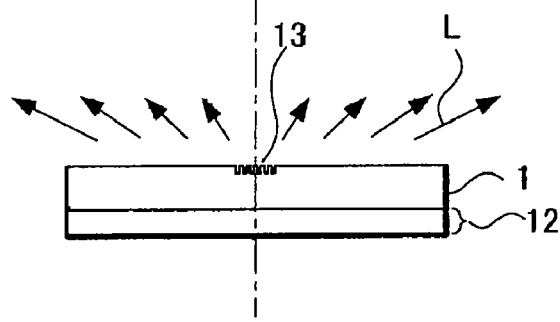
FIG. 12B is a schematic cross-sectional view showing an arrangement of a light-emitting diode device according to an embodiment of the present invention.

Example Five is an example in which a diffraction grating is provided at the position opposing to the central axis of the lens of the substrate 11 and thereby formed as the processed portion 13 when the substrate 11 of the light-emitting diode chip 1 is located on the side of the lens 3 as shown in FIGS. 12A and 12B. This diffraction grating structure can be formed by a suitable method such as pattern etching. Also, it is desirable that the area to be processed should be properly selected in accordance with the purpose in which the light-emitting diode chip 1 is used, the number and arrangement of the light-emitting diodes, the shape of the lens and the like similarly to the above-mentioned respective inventive examples.

When the processed portion 13 having the diffraction grating structure is provided as described above, with respect to light emitted from the light-emitting diode chip 1 along the central axis of the lens, it is possible to adjust a quantity of light emitted in the direction right above the light-emitting diode chip 1 by properly selecting the pitch of the diffraction grating relative to the wavelength of emitted light. Also, a part of light emitted from this light-emitting diode chip 1 can be prevented from being absorbed and hence emitted light can be utilized with high efficiency.

Next, examples in which a processed portion for adjusting light emitted from a light-emitting diode along the central axis of a lens is provided at a processed portion will be described according to an embodiment.

Example Six

Figure 13:
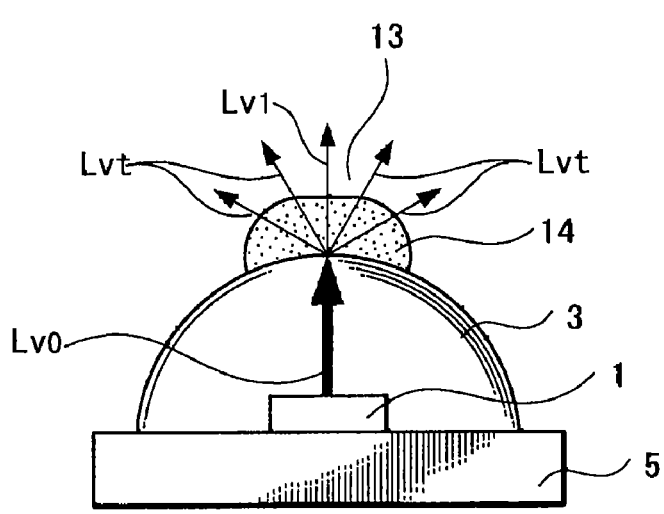
FIG. 13 is a schematic cross-sectional view showing an arrangement of an example of a light-emitting diode device according to the present invention.

FIG. 13 is a schematic cross-sectional view showing an arrangement of an example of a light-emitting diode device. Example Six shows a case in which the light-emitting diode chip 1 is located on a mold 5 and the lens 3 is provided around the mold 5 as shown in FIG. 13. In this sixth inventive example, as shown in FIG. 13, a diffusion material containing low refractive index material portion 14 in which a diffusion material for diffusing light is dispersed into a low refractive index material with a refractive index lower than that of the lens 3 is deposited to the area surrounding at least the central axis of the upper surface of this lens 3 as the processed portion 13.

Most of the lens shape described in NIKKEI ELECTRONICS (NIKKEI BUSINESS PUBLICATION INC.), Dec. 20, 2004, (No. 889), pp. 123 to 130 and the lens shape of the light-emitting diode that radiates light in the lateral direction by controlling the radiation distribution uses total reflection to reflect light, emitted in the direction right above the lens, at the interface relative to air. However, it is difficult to completely remove luminance point produced right above the light-emitting diode, that is, so-called hot spot by only the total reflection.

Although the hot spot can be decreased to some extent by forming the surface right above the lens as a scattering surface, it becomes difficult to satisfy the conditions of the total reflection with the interface relative to air. As a consequence, an amount of reflected light reflected in the lateral direction is lowered.

On the other hand, according to the present invention, the material with the refractive index lower than that of the lens 3 is used and the diffusion material containing low refractive index material portion 14 in which the diffusion material such as bead is dispersed into the low refractive index material is provided on the upper surface of the lens 3, whereby the total reflection condition is constructed at the interface between the lens 3 and the diffusion material containing low refractive index material portion 14. Further, it is possible to adjust light going in the direction right above the lens 3 more by diffusing and reflecting leaked light with the diffusion material. Specifically, as schematically shown by a bold arrow Lv0 in FIG. 13, most of strong light emitted from the light-emitting diode chip 1 in the direction right above the light-emitting diode chip 1 can be reflected in the lateral direction at the processed portion 13 by using total reflection, and light leaked onto the portion 13 can be dispersed and thereby scattered as shown by arrows Lvt in FIG. 13. At that time, although a very small quantity of light is radiated in the direction right above the light-emitting diode chip 1 as shown by an arrow Lv1 in FIG. 13, as compared with the case in which the lens has the shape using only total reflection or the case in which the lens includes the scattering surface, it is possible to decrease a quantity of light going in the direction right above the light-emitting diode chip 1. Also, it is possible to adjust the quantity of light with high accuracy by adjusting the size of the diffusion material and the amount in which the diffusion material is dispersed into the low refractive index material.

Therefore, similarly to the aforementioned respective inventive examples, since color of light going in the direction right above the light-emitting diode and other colors of ambient lights can be mixed satisfactorily, it becomes possible to satisfactorily suppress hot spot so that ununiformity of brightness and ununiformity of color can be suppressed satisfactorily. As a result, similarly to the above-mentioned respective inventive examples, it becomes possible to decrease the thickness of the backlight apparatus using this light-emitting diode device and also it becomes possible to make the backlight apparatus and the liquid-crystal display apparatus using this backlight apparatus become thinner.

Although light is absorbed to some extent in the low refractive index material portion, a quantity of light absorbed therein is considerably small as compared with the case in which the light-emitting diode device includes a reflective film and a photo-absorption material. Therefore, the utilization efficiency of light can be improved and brightness can be made uniform. Hence, it is possible to satisfactorily suppress the occurrence of ununiformity of brightness and ununiformity of color.

In order to maintain a difference of refractive index between the material of the lens 3 and the above-mentioned low refractive index material, it is desirable that the lens 3 should be made of a material of which refractive index is as high as possible and accordingly, the material with a refractive index higher than 1.5 may be suitable as the material of the lens 3. Also, it is desirable that the refractive index of the low refractive index material should be less than approximately 1.4. Further, since degree of diffusion is changed depending on the refractive index difference between the diffusion material and the low refractive index material, the material of the diffusion material may be selected in consideration of this refractive index difference. For example, in order to increase the degree of diffusion, it is desirable that a refractive index should be made high relatively. Considering the case in which the diffusion material will be attached to the interface between the low refractive index material and the lens 3, it is possible that, after the low refractive index material was first coated on the upper surface of the lens 3 to form the interface, the diffusion material containing low refractive index material portion 14 may be formed by coating the diffusion material containing low refractive index material.

While the lens 3 is shaped as a dome-like lens in Example Six, the shape of the lens 3 is not limited to the above-mentioned dome-like one and Example Six can be applied to lenses of various shapes.

Example Seven

Figure 14:
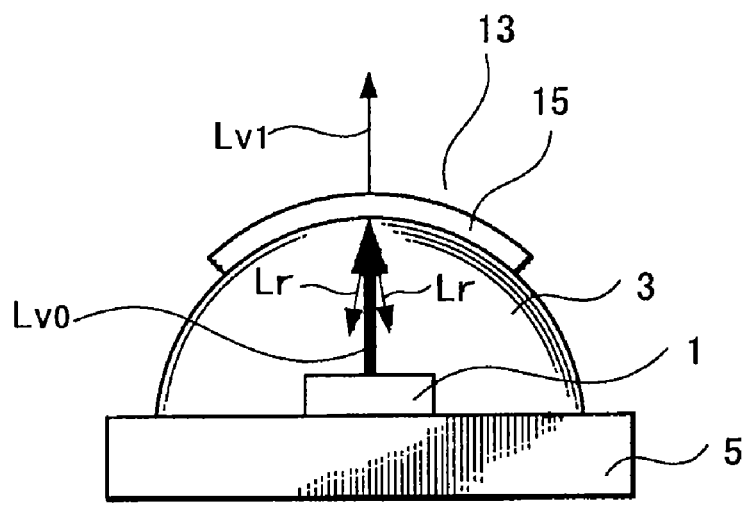
FIG. 14 is a schematic cross-sectional view showing an arrangement of an example of a light-emitting diode device according to the present invention.

Example Seven will be described with reference to FIG. 14. FIG. 14 is a schematic cross-sectional view showing an arrangement of a light-emitting diode device according to the Example Seven. Example Seven shows an example in which an angle selective filter 15 having transmittance corresponding to an angle of incidence of incident light of color with a predetermined wavelength band is deposited on the area surrounding at least the central axis of the upper surface of the lens 3. In FIG. 14, elements and parts identical to those of FIG. 13 are denoted by identical reference numerals and therefore need not be described.

A wavelength selective filter 15 for use with Example Seven can be composed of a dielectric multilayer film in which a plurality of low refractive index layers with low refractive index and high refractive index layers with high refractive index is alternately deposited. Design of this wavelength selective filter 15 can be varied in response to a wavelength band of light emitted from the light-emitting diode chip and an angle distribution of target transmittance.

Also, this angle selective filter 15 can be directly deposited onto the upper surface of the lens 3 by a suitable method such as a sputtering method.

For example, Example Seven shown in FIG. 14 shows the case in which the lens 3 is shaped as a dome-like lens. Light emitted from the central portion, for example, of the light-emitting diode chip 1 along the central axis of the lens 3 as shown by an arrow Lv0 in FIG. 14 is passed through the angle selective filter 15 with desired transmittance as shown by an arrow Lv1 considering its wavelength band and an angle of incidence of the angle selective filter 15 near the central axis of the lens 3 and other lights may be reflected on the lens 3 as shown by arrows Lr. As a consequence, it is possible to adjust the quantity of light radiated in the direction right above the lens 3. Thus, similarly to the above-mentioned respective inventive examples, ununiformity of brightness and ununiformity of color can be suppressed and hence it becomes possible to make the backlight apparatus using such light-emitting diode device and the liquid-crystal display apparatus become thinner.

Example Eight

Figure 15:
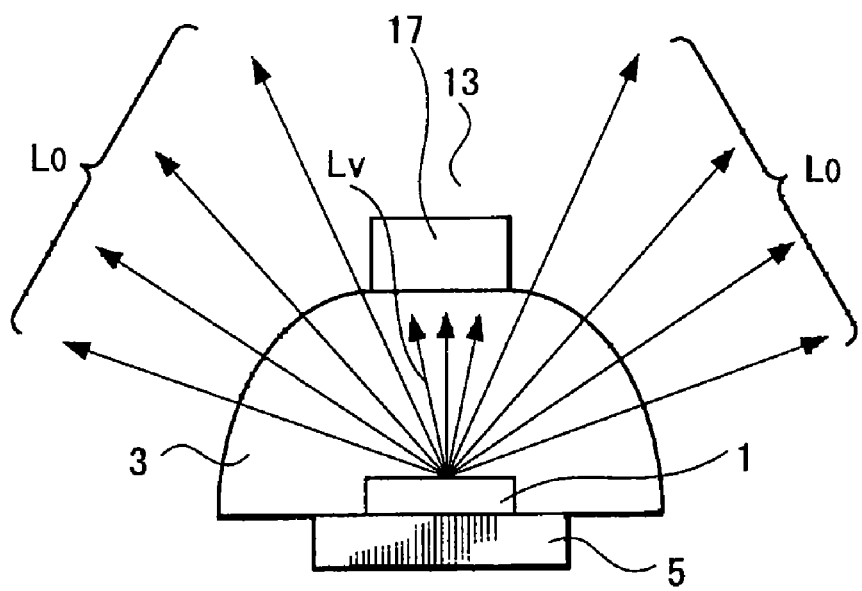
FIG. 15 is a schematic cross-sectional view showing an arrangement of an example of a light-emitting diode device according to the present invention.

Example Eight will be described below with reference to FIG. 15. FIG. 15 is a schematic cross-sectional view showing an arrangement of a light-emitting diode device according to Example Eight. Example Eight shows an example in which a photo-electric conversion portion 17 made of a photodiode, for example, for converting light energy into electric energy is deposited to the area surrounding at least the central axis of the upper surface of the lens 3 as the processed portion 13 as shown in FIG. 15. In FIG. 15, elements and parts identical to those of FIG. 13 are denoted by identical reference numerals and therefore need not be described.

As shown in FIG. 15, since the light-emitting diode chip 1 includes the processed portion 13 formed of the photo-electric conversion portion 17, light going from the light-emitting diode chip 1 along the central axis of the lens 3 as shown by an arrow Lv in FIG. 15 and light near such light can be absorbed by the photo-electric conversion portion 17 such as the photodiode. Thus, the quantity of light going along the central axis of the lens 3 can be decreased as compared with light, shown by an arrow Lo in FIG. 15, emitted in the direction spaced apart from the central axis of the lens on the whole.

Further, when this light-emitting diode device is applied to the backlight apparatus and the liquid-crystal display apparatus, if a function for automatically controlling a drive electric current of the light-emitting diode chip is given to the light-emitting diode device or an external driving circuit, then by an output electric current from the processed portion 13 such as the photodiode for carrying out photoelectric conversion, outputs from the light-emitting diode devices of respective colors, for example, can constantly be made constant or these outputs can be respectively adjusted to desired output values so that lights of respective colors can be mixed satisfactorily. Further, similarly to the above-mentioned respective inventive examples, it is possible to adjust the quantity of light radiated in the direction right above the lens 3. As a consequence, ununiformity of brightness and ununiformity of color can be suppressed and it becomes possible to make the backlight apparatus using this light-emitting diode chip and the liquid-crystal display apparatus become thinner.

Example Nine

Figure 16:
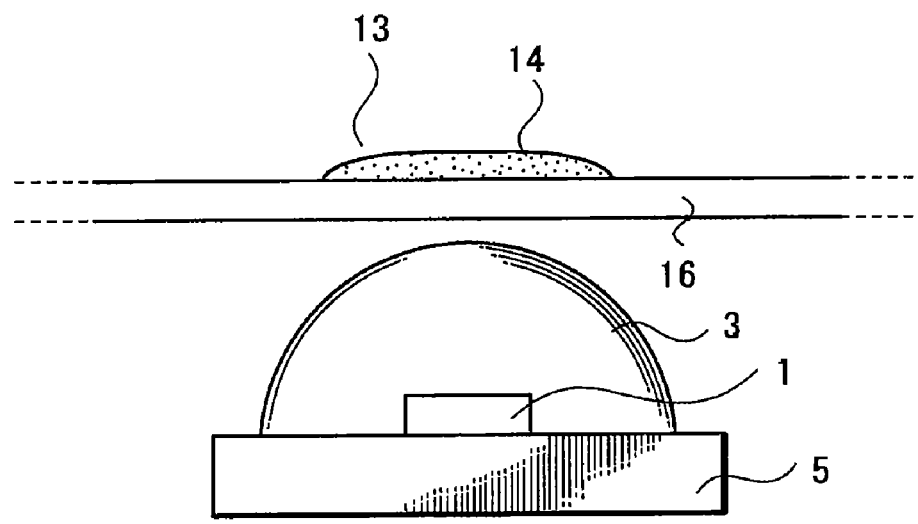
FIG. 16 is a schematic cross-sectional view showing an arrangement of a main portion of an example of a backlight apparatus according to the present invention.

In Example Nine a backlight apparatus according to the embodiment of the present invention will be described with reference to FIG. 16. FIG. 16 is a schematic cross-sectional view showing an arrangement of a main portion of the backlight apparatus according to the embodiment of the present invention. In Example Nine, as shown in FIG. 16, not within the light-emitting diode device, but within the backlight apparatus which has been explained so far with reference to FIG. 6, a transparent supporting substrate 16 is disposed right above the lens 3 of the light-emitting diode device. The transparent supporting substrate 16 may be made of a material which can pass at least light emitted from the light-emitting diode device of each color.

As shown in FIG. 16, the lens 3 is provided around the light-emitting diode chip 1 of the light-emitting diode device. A diffusion material containing low refractive index material portion 1 in which a diffusion material for diffusing light is dispersed into a low refractive index material with refractive index lower than that of the lens 3 is deposited to the position opposing to the area surrounding at least the central axis of this lens 3, that is, the upper surface of the transparent supporting substrate 16 and thereby it is constructed as the processed portion 13. In FIG. 16, elements and parts identical to those of FIG. 13 are denoted by identical reference numerals and therefore need not be described.

Also in this case, similarly to the aforementioned sixth inventive example, light emitted from the light-emitting diode chip 1 in the direction right above the light-emitting diode chip 1 along the central axis of the lens 3 is introduced into the diffusion material containing low refractive index material portion 14 in which it is diffused and reflected by the inside diffusion material and only a part of light may be passed through the transparent supporting substrate 16 and emitted in the direction right above the lens 3, that is, the direction extending along the central axis.

As a result, similarly to the aforementioned sixth inventive example, it is possible to adjust light, emitted in the direction right above the lens 3, which causes hot spot. Accordingly, ununiformity of brightness and ununiformity of color can be suppressed and it becomes possible to make the backlight apparatus and the liquid-crystal display apparatus become thinner. Also in this case, it is possible to improve utilization efficiency of light on the whole.

Example Ten

Figure 17:
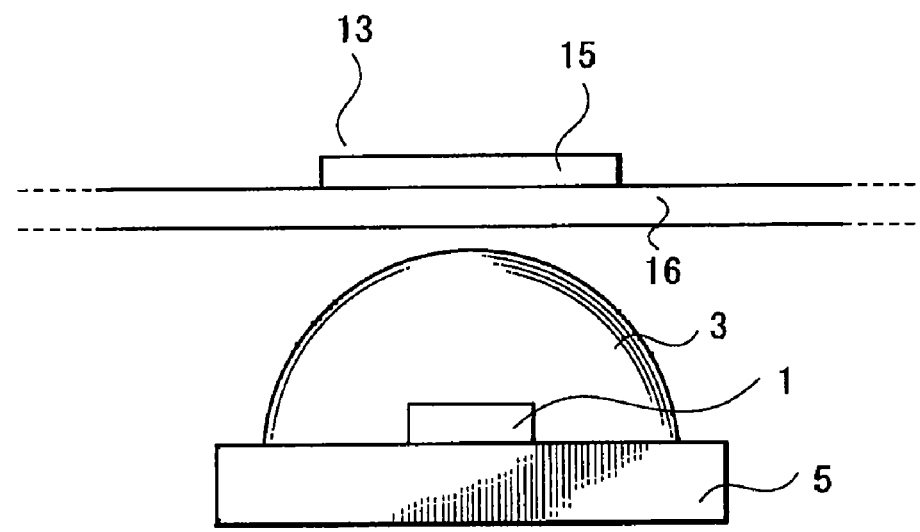
FIG. 17 is a schematic cross-sectional view showing an arrangement of a main portion of an example of a backlight apparatus according to the present invention.

Example Ten of the backlight apparatus according to the present invention will be described below with reference to FIG. 17. FIG. 17 is a schematic cross-sectional view showing an arrangement of a main portion of the tenth inventive example of the backlight apparatus. According to the tenth inventive example, as shown in FIG. 17, the transparent supporting substrate 16 is located right above the light-emitting diode device within the backlight apparatus, and the angle selective filter 15 having transmittance corresponding to an angle of incidence relative to incident light of color with a predetermined wavelength band is provided at the position opposing to the area surrounding at least the central axis of the upper surface of the lens 3 of the light-emitting diode device. In FIG. 17, elements and parts identical to those of FIG. 16 are denoted by identical reference numerals and therefore need not be described.

In this case, the angle selective filter 15 may be partially formed on the flat transparent supporting substrate 16 in pattern by a suitable method such as a sputtering method and the angle selective filters 15 may be located right above the light-emitting diode devices in response to the light-emitting diode devices arrayed within the backlight apparatus, respectively. Thus, it is possible to relatively easily manufacture the angle selective filter 15.

Also in this case, similarly to the aforementioned seventh inventive example, the quantity of light radiated in the direction right above the lens 3 can be adjusted. Accordingly, ununiformity of brightness and ununiformity of color can be suppressed and hence it becomes possible to make the backlight apparatus and the liquid-crystal display apparatus become thinner.

While the diffusion material containing low refractive index material portion 14 and the angle selective filter 15 are provided on the upper surface of the transparent supporting substrate 16, that is, the opposite side of the light-emitting diode device in the above-mentioned ninth and tenth inventive examples, the present invention is not limited thereto and they can be provided on the lower surface of the transparent supporting substrate 16.

By way of example, a difference produced between reflection angles of incident light from the light-emitting diode device 10 when they are provided on the upper surface of the transparent supporting substrate 16 and when they are provided on the lower surface of the transparent supporting substrate 16 will be described.

Figure 18:
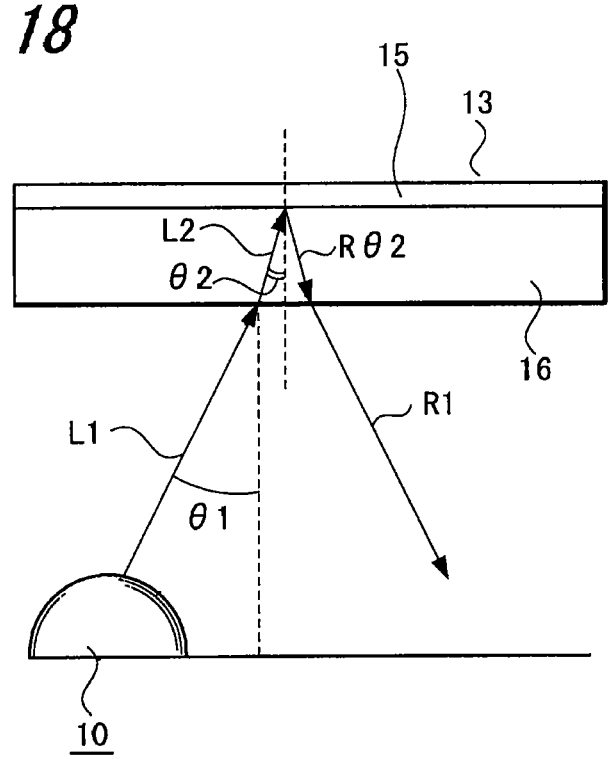
FIG. 18 is a schematic cross-sectional view showing an arrangement of a main portion of an example of a backlight apparatus according to the present invention.

FIG. 18 is a schematic cross-sectional view showing an arrangement of a main portion of a backlight apparatus in the case in which the transparent supporting substrate 16 is located right above the light-emitting diode device 10 and the above-mentioned angle selective filter 15 is provided on the upper surface, that is, the surface of the opposite side of the light-emitting diode device 10 as the processed portion 13.

In this case, assuming that light, shown by an arrow L1 in FIG. 18, emitted from the light-emitting diode device θ1 becomes incident on the surface of the transparent supporting substrate 16 at an angle θ1, then the above light becomes incident on the interface between the transparent supporting substrate 16 and the angle selective filter 15 at an angle θ2 smaller than the above-mentioned angle θ1 due to a refractive index difference as shown by an arrow L2 in FIG. 18. Light, shown by an arrow Rθ2, reflected on this interface, is reflected on the interface at the angle θ2 and thereby it is emitted from the transparent supporting substrate 16 to the outside as shown by an arrow R1 in FIG. 18.

Figure 19:
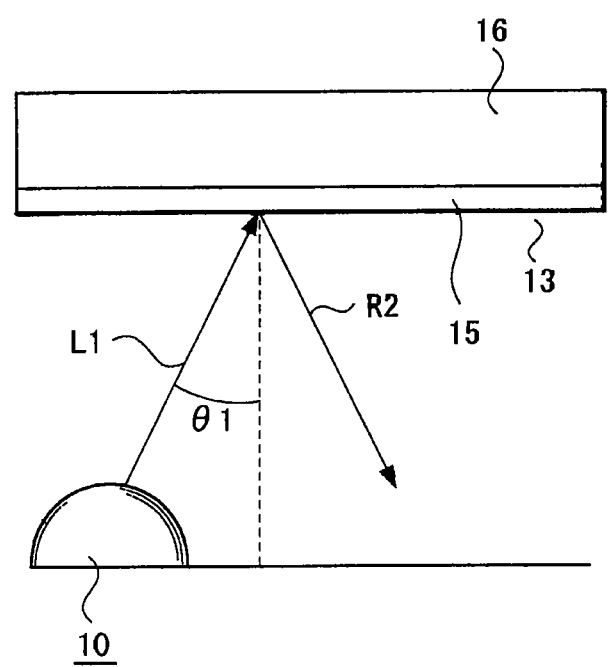
FIG. 19 is a schematic cross-sectional view showing an arrangement of a main portion of an example of a backlight apparatus according to the present invention.

FIG. 19 is a schematic cross-sectional view showing an arrangement of a main portion of an example of a backlight apparatus according to the present invention. As shown in FIG. 19, when the processed portion 13 formed of the angle selective filter 15 is provided on the lower surface of the light transparent supporting substrate 16, light, shown by an arrow L1 in FIG. 19, emitted from the light-emitting diode device 10, is reflected on the surface of the lower side of the angle selective filter 15 at the same angle as the incidence angle θ2 as shown by an arrow R2 in FIG. 19. In FIG. 19, elements and parts identical to those of FIG. 18 are denoted by identical reference numerals and therefore need not be described.

When the angle selective filter 15 has such an arrangement in which reflectance is increased as an incidence angle is decreased, a quantity of light of the reflected light shown by the arrow Rθ2 in FIG. 18 may become larger than a quantity of light of the reflected light shown by the arrow R2. Accordingly, when the angle selective filter 15 is provided on the upper surface of the transparent supporting substrate 16, a larger quantity of light of lights emitted right above the side of the light-emitting diode device 10 can be reflected on the lower side of the angle selective filter 15. Light reflected on the lower side of the angle selective filter 15 can be recycled by providing a suitable means such as a scattering surface on the surface in which a light-emitting diode device, for example, is located.

This relationship will apply for the case in which the diffusion material containing low refractive index material portion 14 is provided on the light-emitting diode device 10 as the processed portion 13 as well.

Other arrangement and positional relationships between the light transparent supporting substrate and the processed portion can be properly selected in response to applied backlight apparatus and liquid-crystal display apparatus.

Figure 20:
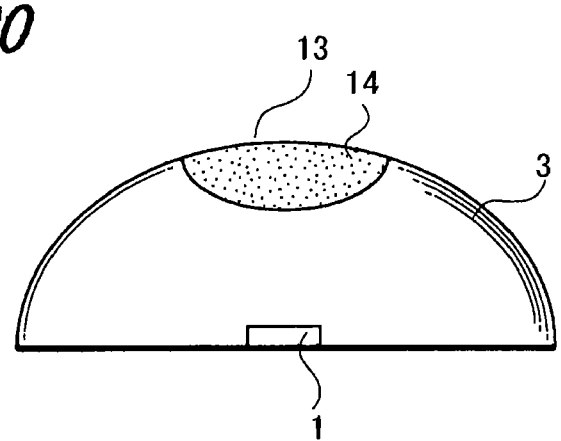
FIG. 20 is a schematic cross-sectional view showing an arrangement of a modified example of a light-emitting diode device according to the present invention.

While the lens is formed as the dome-like lens in the above-described respective inventive examples, the present invention is not limited thereto and the shape of the lens can be modified and changed variously. FIG. 20 is a schematic cross-sectional view showing an arrangement of a modified example of a light-emitting diode device according to the present invention. As shown in FIG. 20, the present invention can be applied to the lens 3 shaped as a convex-like curved surface on the lateral direction and of which upper surface is shaped as a concave-like curved surface. In this case, the diffusion material containing low refractive index material portion 14, similar to those examples described so far with reference to FIGS. 13 and 16, may be deposited on the lens 3 so as to fill the concave portion of the upper surface, for example, of the lens 3.

Figure 21:
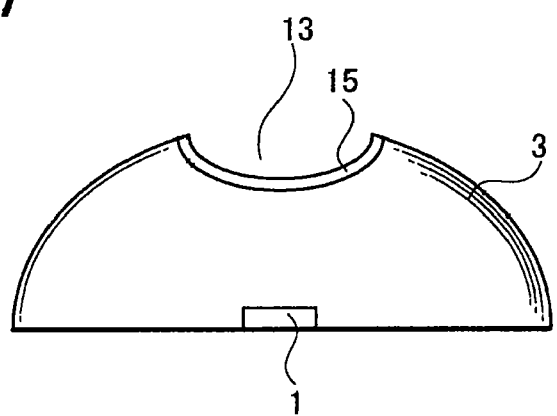
FIG. 21 is a schematic cross-sectional view showing an arrangement of a yet modified example of a light-emitting diode device according to the present invention.

FIG. 21 is a schematic cross-sectional view showing an arrangement of a further modified example of a light-emitting diode device according to the present invention. Also, in a like manner, as shown in FIG. 21, the angle selective filter 15 may be deposited on the concave-like upper surface of the lens 3 which is shaped similarly to the modified example shown in FIG. 20. In FIGS. 20 and 21, elements and parts identical to those of FIGS. 13 and 14 are denoted by identical reference numerals and therefore need not be described.

It is needless to say that these modified examples can achieve effects similar to those of the aforementioned respective inventive examples.

As described above, according to the present invention, the shape of the lens can be varied with similar effects to those of the above-mentioned respective inventive examples being achieved.

Further, according to the present invention, there can be obtained various arrangements in which the processed portions in the above-mentioned respective inventive examples may be combined.

Specifically, the light-emitting diode chips 1 that have been described so far in the aforementioned respective inventive examples shown in FIGS. 8 to 12 may be used and further the above-mentioned diffusion material containing low refractive index material portion or the angle selective filter may be provided on the upper surface of the lens 3 or right above the lens 3.

Figure 22:
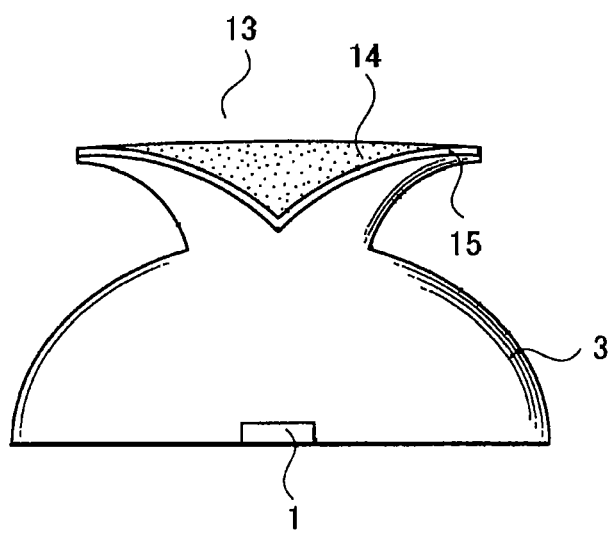
FIG. 22 is a schematic cross-sectional view showing an arrangement of a yet further modified example of a light-emitting diode device according to the present invention.

FIG. 22 is a schematic cross-sectional view showing an arrangement of a yet further modified example of a light-emitting diode device according to the present invention.

As shown in FIG. 22, the angle selective filter 15 may be deposited on the upper surface of the lens 3 by a suitable method such as a sputtering method and the diffusion material containing low refractive index material portion 14 may be deposited on the angle selective filter 15. As shown in FIG. 22, this modified example shows the case in which the lens 3 is shaped as a convex-like curved surface in the lateral direction, the upper portion thereof having a funnel type curved surface. It is desirable that the angle selective filter 15 and the diffusion material containing low refractive index material portion 14 should be respectively deposited on the funnel-like upper surface in a wide area which may reflect light emitted from the light-emitting diode chip 1 in the direction right above the lens 3. In this modified example, it is desirable that the angle selective filter 15 and the diffusion material containing low refractive index material portion 14 should be deposited on the whole surface covering the edge portions of the upper surface.

As described above, when the angle selective filter 15 and the diffusion material containing low refractive index material portion 14 are deposited on the funnel-like upper surface of the lens 3 in a bilayer arrangement fashion, it is possible to more effectively suppress light radiated in the direction right above the lens so that the occurrence of the so-called hot spot can be suppressed. Accordingly, a quantity of light can be fine adjusted much more by the two processed portions 13 and ununiformity of brightness and ununiformity of color can be suppressed satisfactorily. Further, it becomes possible to decrease the thicknesses of the backlight apparatus and the liquid-crystal display apparatus.

Further, other arrangements composed of a plurality of combinations of the processed portions 13 in the respective inventive examples may also be possible with similar effects being achieved.

As set forth above, according to the present invention, it becomes possible to adjust a quantity of light radiated in the direction right above the light-emitting diode device from the light-emitting diode along the central axis of the lens. Accordingly, when the light-emitting diode device according to the present invention is applied to the backlight apparatus and the liquid-crystal display apparatus, ununiformity of brightness and ununiformity of color can be suppressed and also it becomes possible to make the backlight apparatus and the liquid-crystal display apparatus become thinner. Further, it is possible to improve utilization efficiency of light as compared with the case in which light is absorbed in the light-emitting diode.

Further, the present invention is not limited to the above-described embodiments and the arrangement of the light-emitting diode chip and the shapes of the outside and inside of the lens and other arrangements can be variously modified and altered without departing from the arrangements of the present invention.

As described above, according to the light-emitting diode device of the present invention, it is possible to adjust the quantity of light emitted right above the light-emitting diode device.

Also, according to the backlight apparatus and the liquid-crystal display apparatus of the present invention, it is possible to improve ununiformity of brightness and ununiformity of color.

It should be understood by those skilled in the art that various modifications, combinations, sub-combinations and alterations may occur depending on design requirements and other factors insofar as they are within the scope of the appended claims or the equivalents thereof.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A light-emitting diode device having a lens provided around a light-emitting diode chip, comprising:
a processed portion for adjusting light emitting from said light-emitting diode chip along a central axis of said lens provided directly on said light-emitting diode chip.

2. A light-emitting diode device according to claim 1, wherein said light-emitting diode chip has a dim structure or a non-light-emitting structure formed as said processed portion opposed to a central axis of said lens of a light-emitting structure portion.

3. A light-emitting diode device according to claim 1, wherein said light-emitting diode chip has a structure disposed on a side of said lens, a curved surface or an inclined surface having a tangential line which does not cross said central axis at right angles being provided on said substrate of said light-emitting diode chip at its position opposing said central axis of said lens to thereby form said processed portion.

4. A light-emitting diode device according to claim 1, wherein said light-emitting diode chip has a substrate being disposed on a side of said lens, said substrate of said light-emitting diode chip being formed as a rough surface at a position opposing to the central axis of said lens to thereby form said processed portion.

5. A light-emitting diode device according to claim 1, wherein said light-emitting diode chip has a structure being disposed on a side of said lens, said substrate of said light-emitting diode chip having a diffraction grating being provided at a position opposing to the central axis of said lens to thereby form said processed portion.

6. A light-emitting diode device according to claim 1, wherein said light-emitting diode device has a diffusion material containing low refractive index material portion in which a diffusion material for diffusing light is dispersed into a low refractive index material with refractive index lower than that of said lens deposited on an area surrounding at least a central axis of the upper surface of said lens as said processed portion.

7. A light-emitting diode device according to claim 1, wherein said light-emitting diode device has an angle selective filter having transmittance corresponding to an angle of incidence relative to incident light of color having a predetermined wavelength band deposited on an area surrounding at least a central axis of the upper surface of said lens as said processed portion.

8. A light-emitting diode device according to claim 1, wherein said light-emitting diode device has a photo-electric conversion portion provided on an area surrounding at least a central axis of the upper surface of said lens as said processed portion.

9. A light-emitting diode device according to claim 1, wherein the processed portion is formed as a pattern which does not emit light or which reduces the amount of emitted light.

10. A backlight apparatus for illuminating a transmissive type liquid-crystal display panel from a back side, comprising:

a light source being composed of a plurality of light-emitting diode devices of which lens is covered around a light-emitting diode chip; and a processed portion for adjusting light emitting from said light-emitting diode chip along the central axis of said lens being provided directly on said light-emitting diode chip.

11. A backlight apparatus according to claim 10, wherein said backlight apparatus has a transparent supporting substrate disposed right above said lens as said processed portion, a diffusion material containing low refractive index material portion in which a diffusion material for diffusing light is diffused into a low refractive index material with a refractive index lower than that of said lens being deposited on a position opposing the area surrounding at least the central axis of said lens.

12. A backlight apparatus according to claim 10, wherein a transparent supporting substrate is disposed right above said lens as said processed portion, an angle selective filter having transmittance corresponding to an angle of incidence relative to incident light of color with a predetermined wavelength band being deposited at the position opposing the area surrounding at least the central axis of the upper surface of said lens.

13. A liquid-crystal display apparatus comprising:

a transmissive type liquid-crystal display panel; and a backlight apparatus for illuminating said liquid-crystal display panel from a back side, wherein a light source of said backlight apparatus is composed of a plurality of light-emitting diode devices of which lens is covered around a light-emitting diode chip, a processed portion for adjusting light going from said light-emitting diode chip along the central axis of said lens being provided directly on said light-emitting diode chip.

* * * * *